US007005233B2

(12) United States Patent
Fang

(10) Patent No.: US 7,005,233 B2

(45) Date of Patent: Feb. 28, 2006

(54) PHOTORESIST FORMULATION FOR HIGH ASPECT RATIO PLATING

(75) Inventor: Treliant Fang, Dublin, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/853,858

(22) Filed: May 26, 2004

(65) Prior Publication Data

US 2004/0214098 A1 Oct. 28, 2004

Related U.S. Application Data

(63) Continuation of application No. 10/027,437, filed on Dec. 21, 2001, now abandoned.

(51) Int. Cl.
*G03F 7/038* (2006.01)
*G03F 7/075* (2006.01)
*G03F 7/085* (2006.01)

(52) U.S. Cl. .................. 430/280.1; 430/912; 430/927; 522/79; 522/77

(58) Field of Classification Search .............. 430/280.1
See application file for complete search history.

(56) References Cited

U.S. PATENT DOCUMENTS

| | | | | |
|---|---|---|---|---|
| 3,658,543 | A | 4/1972 | Gerlach, Jr. et al. | |
| 3,758,306 | A | 9/1973 | Roos | |
| 3,981,897 | A | 9/1976 | Crivello | |
| 4,237,216 | A | 12/1980 | Skarvinko | |
| 4,732,858 | A * | 3/1988 | Brewer et al. | 430/272.1 |
| 4,882,245 | A * | 11/1989 | Gelorme et al. | 430/14 |
| 5,026,624 | A | 6/1991 | Day et al. | |
| 5,102,772 | A | 4/1992 | Angelo et al. | |
| 5,268,260 | A | 12/1993 | Bantu et al. | |
| 6,022,050 | A * | 2/2000 | Kline | 522/148 |
| 6,409,312 | B1 * | 6/2002 | Mrvos et al. | 347/54 |
| 6,439,698 | B1 * | 8/2002 | Patil | 347/64 |
| 6,459,771 | B1 * | 10/2002 | Mancini | 378/154 |
| 2002/0076651 | A1 * | 6/2002 | Hurditch et al. | 430/280.1 |
| 2002/0128353 | A1 * | 9/2002 | Konarski et al. | 523/461 |
| 2003/0138731 | A1 | 7/2003 | Fang | |

FOREIGN PATENT DOCUMENTS

WO WO 99/142277 A * 3/1999

OTHER PUBLICATIONS

Daniel et al, pp. 40-48 from Karam et al eds, Conference held Sep. 18-20, 2000 in Santa Clara, USA, Proceedings of SPIE, Micromachining and Microfabriacaton Process Technology VI, vol. 4174 (2000).*

Shaw et al. "Negative Photoresists for Optical Lithograph", 0018-8646/97 copyright IBM, pp. 1-16. Http:// www.research.ibm.com/journal/rd/411/shaw.txt (printed Oct. 20, 2001).*

SU-8: A Thick Photo-Resist for MEMS, SOTECm website: Introduction: Physical Properties: Other Properties; Process Tips; Research Links; Commercial Solutions; Literature Reference (created Jan. 1999-modified Feb. 22, 2001)-http://aveclafaux.freeservers.com/SU-8.html (printed Sep. 11, 2001; pp. 1-11).

MicroChem Product Information Sheet "SU-8 Resists" Product Attributes: Additional Benefits of SU-8 2000; Applications for SU-8 and SU-8 2000. (MicroChem Corp. 2000) http://www.microchem.com/products/su_eight.htm (printed Sep. 12, 2001), p. 1).

MicroChem Product Information Sheet "SU-8 Resistes—FAQs" (MicroChem Corp. 2001) http:www.microchem.com/products/su_eight_faq.htm (printed Sep. 12, 2001), pp. 1-2).

MicroChem Product Information: NANO™SU-8 Negative Tone Photoresists Formulations 50 & 100 (MicroChem Corp. 2001), pp. 1-4.

MicroChem Product Information: NANO™SU-8 Negative Tone Photoresists Formulation 2-25 (MicroChem Corp. 2001), pp. 1-4.

* cited by examiner

*Primary Examiner*—Cynthia Hamilton
(74) *Attorney, Agent, or Firm*—N. Kenneth Burraston

(57) ABSTRACT

SU-8 photoresist compositions are modified to improve their adhesion properties by adding 1% to 6% of an adhesion promoter selected from the group consisting of glycidoxypropanetrimethoxysilane, mercaptopropyltrimethoxysilane, and aminopropyltrimethoxysilane. SU-8 photoresist compositions are modified to improve their resistance to cracking and film stress by adding 0.5% to 3% of a plasticizer selected from the group consisting of dialkylphthalates, dialkylmalonates, dialkylsebacates, dialkyladipates, and diglycidyl hexahydrophthalates. The improvements can be obtained simultaneously by adding both the adhesion promoter and the plasticizer to SU-8 photoresist compositions.

30 Claims, No Drawings

PHOTORESIST FORMULATION FOR HIGH ASPECT RATIO PLATING

REFERENCE TO RELATED APPLICATIONS

This application is a continuation of U.S. patent application Ser. No. 10/027,437 filed Dec. 21, 2001 (abandoned).

FIELD OF THE INVENTION

The present invention relates generally to photoresist masks for high aspect ratio plating on semiconductor circuit boards, and more particularly to improvements in negative photoresist masks made from octafunctional epoxidized novolac resins such as SU-8.

BACKGROUND OF THE INVENTION

Negative photoresist masks are commonly employed in the lithographic processes used to build integrated circuit boards. As is known in the art, lithography is a process by which geometric shapes are transferred from a mask onto the surface of a substrate. These geometric shapes, when transferred onto the surface of a silicon wafer, make up the parts of the circuit, such as gate electrodes, contact windows, probe electrodes, switches, metal interconnections, and the like.

The steps of the lithographic process are generally as follows. First, a conductive layer, such as an oxide layer, is formed on a base semiconductor (e.g., silicon) substrate. Next, a photosensitive polymer film or photoresist layer is deposited on the wafer evenly covering the second material layer. Then, the photoresist layer is selectively fixed to produce a desired pattern thereon. This is done by selectively exposing the photoresist layer with ultraviolet light or other radiation, with the selective exposure defining the desired pattern.

Then, the unfixed portions of the photoresist layer are removed by a solvent rinse. (The unfixed portions may be either the exposed or non-exposed areas of the photoresist layer depending upon the type of polymer used.) At this point the surface of the wafer is covered by a conductive layer with a desired design "masked" thereon.

The next step is to etch away the exposed second material layer while leaving the fixed portions of the photoresist layer intact. This is typically done by etching with an etchant that attacks the second material layer but not the photoresist layer, such as by hydrofluoric acid (HF), etching the exposed silicon dioxide ($SiO_2$) while leaving the HF-resistant polymer photoresist layer intact. Excess etchant is rinsed away after the etching step followed by a chemical removal of the photoresist layer with a solvent solution. The wafer is then rinsed to remove excess solvent and is now ready for the next photoresist step to occur.

A typical IC device requires between about five and eleven lithographic deposition layers, more if the device is fairly complex. Each of those layers corresponds to a separate type of device in the circuit, such as gate electrodes, contact windows, probe electrodes, switches, metal interconnections, and the like.

It can be seen from the above that the masking (photoresist) material must adhere firmly to the substrate, and must maintain planarity to very high tolerance levels.

One group of commonly used photoresist materials are those based on octafunctional epoxidized novolac resins, and particularly those based on the SU-8 family of photoresists made from Shell Chemical's EPON® SU-8 epoxy resin. The SU-8 photoresist materials are negative, epoxy-type, near-UV photoresist materials. The SU-8 family of photoresist materials is popular because it can provide relatively thick-film (2 mm or larger) photoresist films having aspect ratios greater than 20 at relatively low costs. In addition to being a relatively thick-film photoresist material, SU-8 is well suited for acting as a mold for electroplating because of its relatively high thermal stability ($T_g$ greater than 200 degrees C. for the cross-linked or post-exposure photoresist material).

While the SU-8 family of photoresist materials enjoys relatively wide use and positive results as a photoresist in IC lithography, its utility is somewhat limited for use with silicon wafers greater than three or four inches in diameter. As with most polymer photoresists, the SU-8 family of photoresist materials is prone to delamination and via cracking arising from high film stress when used with relatively large silicon wafers.

Another problem with the SU-8 family of photoresists arises from adhesion problems with certain substrate materials. For example, SU-8 does not adhere as readily to metallic copper as it does to copper oxide.

The IC device industry is constantly demanding larger and/or more complex devices. As the size and complexity of the demanded IC devices increase, the need arises for a photoresist material having reduced film stress and increased adhesion properties for use in the lithography process to make such devices. The present invention addresses that need.

SUMMARY OF THE INVENTION

Briefly describing one aspect of the present invention, there is provided a photoresist composition for high aspect ratio lithography. The composition comprises an octafunctional epoxidized novolac resin such as SU-8, an organic solvent, a photopolymerization initiator, a plasticizer, and an adhesion promoter. The adhesion promoter is effective for improving the adhesion of the mask, particularly onto copper-based substrates. The plasticizer reduces delamination and via cracking between the photoresist film and the substrate, making larger wafers commercially viable.

One object of the present invention is to provide an improved photoresist composition for lithographic processes.

Further aspects and advantages of the present invention will be apparent from the following description.

DESCRIPTION OF THE PREFERRED EMBODIMENTS

For the purposes of promoting an understanding of the principles of the invention, reference will now be made to the preferred embodiments and specific language will be used to describe the same. It will nevertheless be understood that no limitation of the scope of the invention is thereby intended, with such alterations and further modifications of the described embodiments being contemplated as would normally occur to one skilled in the art to which the invention relates.

As indicated above, one aspect of the present invention is an improved negative photoresist masking composition. In one preferred embodiment the composition comprises an octafunctional epoxidized novolac resin, an organic solvent, a photopolymerization initiator, a plasticizer, and an adhesion promoter. The inventive photoresist masking composition has improved adhesion on copper-based substrates, and resists cracking and other film stresses so that larger MEMS wafers can be made.

Referring first to the components of the preferred composition, the photoresist composition of the present invention comprises an octafunctional epoxidized novolac resin appropriate for building high-aspect ratio masks for MEMS lithography. The preferred resin is EPON® SU-8 epoxy resin, available from the Shell Chemical Company. That resin is described by the formula:

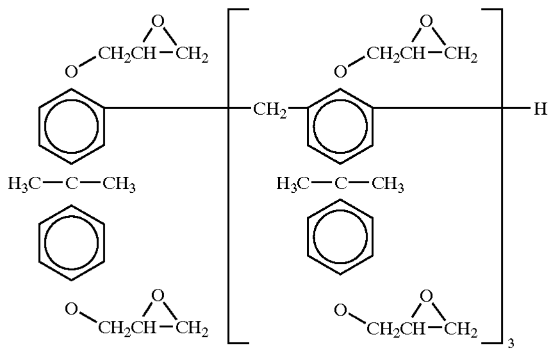

In the inventive masking compositions the resin is preferably present in an amount ranging from about 50% to about 75%. More preferably, the resin comprises between about 60% and 65% of the masking composition, with 62% to 63% resin being most preferred.

As is known to the art, a solvent is typically used to make epoxy-resin based masking compositions. In the preferred embodiment the solvent is an organic solvent with a boiling point of between about 160° C. and 260° C. More preferably the solvent has a boiling point of between about 190° C. and 220° C. The most preferred solvent is γ-butyrolactone, with a boiling point of about 205° C.

The solvent is preferably present in an amount ranging from about 15% to about 45%. In the more preferred embodiments about 20–30% solvent is used, with about 25% solvent being used in the most preferred embodiment.

The photoresist composition also includes a photopolymerization initiator. As is known to the art, the photopolymerization initiator is a material that promotes cross-linking of the resin when exposed to optical radiation. The cross-linking makes the resin insoluble to the developing solution used to pattern the semiconductor device.

One class of photopolymerization initiator (hereinafter alternatively referred to as either a photoinitiator or a cationic initiator) useful for the present invention is the class of triaryl sulphonium $SbF_6$ salts. For example, Cyracure® 6974, available from the Union Carbide Corp., is particularly preferred.

The photoinitiator is preferably present in an amount ranging from about 3% to about 10%. More preferably the initiator is present in an amount ranging from about 5% to 8%, with about 6% to about 7% photoinitiator being most preferred.

An adhesion promoter is preferably added to the masking compositions to improve its adhesion characteristics (i.e., increase the relative tackiness of the composition and/or increase the scope of materials to which the composition significantly adheres). The adhesion promoter is preferably a member selected from the group consisting of glycidoxypropanetrimethoxysilane, mercaptopropyltrimethoxysilane, and aminopropyltrimethoxysilane.

In the most preferred embodiment the adhesion promoter is glycidoxypropanetrimethoxysilane (GPTMS). In other preferred embodiments the adhesion promoter is another silicone containing adhesion promoter, such as mercaptopropyltrimethoxysilane (MPTMS) or aminopropyltrimethoxysilane (APTMS). Any of these adhesion promoters, or others, may be use alone or in combination as desired to tailor the adhesion characteristics of the mask. For example, MPTMS is particularly useful as an adhesion promoter when the composition is desired to adhere to gold.

The adhesion promoter is preferably added in concentrations of between about 1 and about 6 weight percent. Concentrations of between about 3% and 4% are more preferred in testing to date. Since the adhesion promoter can affect the viscosity of the composition (hampering deposition of the composition as a film) and/or promote phase separation of the composition (resulting in an inhomogeneous film with inhomogeneous physical, chemical, and/or mechanical properties), those factors should be taken into account when selecting adhesion promoter concentration levels.

A plasticizer is preferably added to the masking composition to reduce film stresses and allow the manufacture of larger (e.g., 8") wafers. The plasticizer is preferably a member selected from the group consisting of dialkylphthalates, dialkylmalonates, dialkylsebacates, dialkyladipates, and diglycidyl hexahydrophthalates.

In the most preferred embodiment the plasticizer is dioctylphthalate (DOP). Other preferred plasticizers include the dialkyl esters of dicarboxylic acid, wherein the dicarboxylic acids are between 1 and 18 carbon atoms in length (such as, for example, dialkylphthalates, dialkylsebacates, dialkylmalonates, dialkyladipates and the like). Epoxy-containing plasticizers such as diglycidyl hexahydrophthalate may be also used.

It should be noted that the phthalates have positional isomers, but these do not substantially affect their effectiveness as plasticizers. Likewise, the alkyl groups may be straight chain, branched chain, aromatic and/or cyclic. These plasticizers may be added, either alone or in combination, to tailor the plasticity of the resultant composition.

The plasticizer is preferably added in an amount sufficient to substantially reduce film stresses in films spun from about 5 to 50 mm thick, but is insufficient to cause excessive softening of the composition to the extent that contact printing difficulties arise. Also, excessive plasticizer can decrease the photo speed of the film. Therefore, plasticizer is added in an amount sufficient to substantially reduce film stress but insufficient to adversely affect film photo speed or contact printability.

In the preferred embodiments the plasticizer is present in amounts ranging from 0.5 weight percent to 3.0 weight percent.

As to how to make and use the inventive compositions, the epoxy-based photoresist compositions are preferably prepared by dissolving the epoxy resin in the organic solvent to form a solution. The plasticizer is next added to the solution and the solution is mixed to substantially achieve uniformity. Next, the cationic initiator is separately added to the solution and the solution is again mixed until substantially uniform. Finally, the adhesion promoter is added to the solution and the solution is immediately mixed to result in a substantially uniform or homogeneous solution.

While the additives (i.e., the plasticizer, the adhesion promoter and the cationic initiator) may be added in any convenient order, the above sequence is preferred. Likewise, while mixing the solution after the addition of each of additives is preferred, mixing may be delayed until two or all of the additives have been added to the solution. Thorough and immediate mixing is preferred after the addition of the adhesion promoter to minimize reaction of the adhesion promoter with the remaining ingredients of the solution; delayed or incomplete mixing can result in gel formation.

After mixing, the solution may be milky due to air entrapment during the mixing process, and natural debubbling is preferred by storing the mixture in an amber glass container or the like and/or in a dark environment for a sufficient time for the entrapped gas to escape from the solution.

As discussed above, devices may be built on semiconducting wafers by a series of photolithographic processing steps. In the first photolithographic step, the photoresist film may be applied to a silicon wafer by methods known in the art, such as by spin deposition. The thickness of the film is a function of the coating process (such as the RPM chosen during spin deposition, spin deposition time, and the like), the viscosity of the photoresist composition, the amount of photoresist composition used, and the like. Typically the film is between about 1 micron and about 200 microns thick, with film thicknesses of between about 50 microns and 200 microns commonly being prepared.

After the wafer has been coated with the photoresist film, the wafer is dried to remove excess solvent. Drying may be accelerated by a pre-exposure bake of the wafer. Typically the pre-exposure bake lasts between 3 and 5 hours at a temperature approaching about 90–95 degrees C. The photoresist film is fixed by selectively exposing it to high energy electromagnetic radiation, preferably ultraviolet or near-ultraviolet light, on the order of from about 1000 to 2500 mJ. After fixing, the film undergoes a post-exposure bake (PEB) at about 55° C. for a predetermined length of time, typically up to 1 or 2 hours.

Unfixed photoresist film is removed with a solvent and further processing of the wafer such as deposition of material and/or etching of material is done at this time. After these device processing and building steps have been completed, the photolithographic process is then repeated to build the next step in the series.

Reference will now be made to specific examples using the compositions and methods described above. It is to be understood that the examples are provided to more completely describe preferred embodiments, and that no limitation to the scope of the invention is intended thereby.

EXAMPLE 1

Preparation of Unmodified SU-8 Masking Composition

A two-step process is used to produce SU-8 photoresist without adhesion and plasticity modification.

Stock Solution. In a 2L mixing container equipped with a mechanical stirrer or roller add 624 g of solid Epon SU-8 resin and 262 g of Gama-butyrolactone. The mixture is allowed to soak with occasional agitation until a viscous homogeneous solution is formed. This is a slow dissolution process and may take between 1–5 days to complete. The process can be accelerated by heating to about 60° C. if needed. Make sure the container is properly sealed during the process so that water absorption is kept to a minimum.

The solution then can be filtered through a 5 μm filter bag at elevated temperature to ensure gel-free resin stock solution. The above operation can be performed under normal lighting.

Final mixture. To 886 g of the resin stock solution under yellow light, add 63 g of filtered Cyracure® 6974 and mix with a mechanical stirrer until a uniform solution is formed (800 rpm for 20 min).

EXAMPLE 2

Preparation of Modified SU-8 Masking Composition

A two-step mixing process is also used to produce the modified GD41 solution:

Stock Solution. In a 2 L mixing container equipped with a mechanical stirrer or roller add 624 g of solid Epon SU-8 resin, 262 g of Gama-butyrolactone, and a 10 g of dioctyl phthalate (DOP). The mixture is allowed to soak with occasional agitation until a viscous homogeneous solution is formed. This is a slow dissolution process and may take between 1–5 days to complete. The process can be accelerated by heating to about 60° C. if needed. Make sure the container is properly sealed during the process so that water absorption is kept to a minimum. The solution is then filtered through a 5 μm filter bag at elevated temperature to ensure gel-free resin stock solution. The above operation can be performed under normal lighting.

Final mixture. To 896 g of resin stock solution under yellow light, add 64 g of filtered Cyracure® 6974 and mix with a mechanical stirrer until a uniform solution is formed (about 800 rpm for 10 min). Forty grams of filtered glycidoxyproprane-trimethoxysilane (GPTMS) is then added and mixed at about 800 rpm for 20 min. The final blend should be uniformly milky due to air entrapment during mixing and natural debubbling by storing the mixture in an amber glass container in a dark cabinet should be completed within 36 hours. Both Cyracure® 6974 and glycidoxyproprane-trimethoxysilane should be filtered by 1 μm syringe filters prior to addition to the resin stock solution. Since CPTMS in its concentrated form will react with the remaining ingredients to form a gel, it is desirable to minimize the delay between addition and mixing to avoid gel formation.

EXAMPLE 3

Preparation of Alternative Modified SU-8 Masking Composition

A photoresist composition was made by combining the following components with mixing: 62.4% SU-8 resin, 26.2% γ-butyrolactone, 6.3% Cyracure® 6974, 1% DOP, and 4% GPTMS, all on a weight percent basis. The photoresist was prepared under yellow light, stored in an opaque container, and allowed to debubble. The coating was applied to copper seed silicon wafers, was dried, exposed, and submitted to a PEB to provide a photoresist film with superior adhesion and film stress properties.

EXAMPLE 4

Preparation of Alternative Modified SU-8 Masking Composition

A photoresist composition was made by combining the following components with mixing: 60% SU-8 resin, 30% γ-butyrolactone, 6% Cyracure® 6974, 1% percent DOP, and 6% GPTMS, all on a weight percent basis. The photoresist was prepared under yellow light, stored in an opaque container, and allowed to debubble. The coating was applied to copper seed silicon wafers, was dried, exposed, and submitted to a PEB to provide a photoresist film with superior adhesion and film stress properties.

EXAMPLE 5

Preparation of Modified SU-8 Masking Composition Without Adhesion Improver

A photoresist composition was made by combining the following components with mixing: 60% SU-8 resin, 30% γ-butyrolactone, 7% Cyracure® 6974, and 3% percent DOP, all on a weight percent basis. The photoresist was prepared under yellow light, stored in an opaque container, and allowed to debubble. The coating was applied to copper seed silicon wafers, was dried, exposed, and submitted to a PEB to provide a photoresist film with superior film stress properties.

EXAMPLE 6

Preparation of Modified SU-8 Masking Composition Without Plasticizer

A photoresist composition was made by combining the following components with mixing: 68% SU-8 resin, 20% γ-butyrolactone, 6% Cyracure® 6974, and 6% GPTMS, all on a weight percent basis. The photoresist was prepared under yellow light, stored in an opaque container, and allowed to debubble. The coating was applied to copper seed silicon wafers, was dried, exposed, and submitted to a PEB to provide a photoresist film with superior adhesion properties.

EXAMPLE 7

Verification of Improved Adhesion Properties

Physical tests to measure the difference in adhesion between modified and unmodified SU-8 epoxy resin-based photoresist materials were conducted. The two resins (modified and unmodified) were prepared generally as described above. The modified masking composition comprised about 62.4 weight percent SU-8 resin, 26.2 weight percent γ-butyrolactone, 6.3 percent Cyracure® 6974, 1.0 percent DOP, and 4.0 percent GPTMS. Each composition was applied to an untreated copper seed wafer.

Adhesion was measured by a block shearing method, wherein each block is a 210 micron square with a thickness of approximately 140 microns. Both systematic die site and random walk sampling were taken. The die site is defined by the central 12 by 16 die array with (1, 1) being the lower left corner die. Using die site sampling, the wafer average sheer force for the unmodified SU-8 material was 49.5 grams while the wafer average sheer force for the modified SU-8 material was 63.6 grams, showing a 28 percent improvement over the unmodified SU-8. Likewise, for the random walk testing, the wafer average sheer for the unmodified SU-8 was 51.3 grams while the wafer average for the modified SU-8 was 61.2 grams, showing an improvement of 19 percent.

The Tables below show the results.

TABLE I

Adhesion test of unmodified SU-8 by block shearing on untreated Cu seed wafers. Each block is a 210 um square with thickness ~140 um. Both systematic die site and random walk sampling were taken. Die site is defined by the central 12 × 16 die array with (1, 1) being the lower-left corner die. SU-8 on Cu, No ash, Test speed: 50 um/s Land speed: 250 um/s Shear height: 10 um Overtravel 10 um

| Die | Shear (g) n = 20 | Die | Shear (g) n = 20 | Die | Shear (g) n = 20 |
|---|---|---|---|---|---|
| 1, 1 | 42.02 (4.44) | 1, 6 | 44.75 (2.80) | 1, 12 | 37.46 (8.79) |
| 8, 1 | 41.09 (1.81) | 8, 6 | 48.14 (3.10) | 8, 12 | 42.25 (4.03) |
| 16, 1 | 64.91 (5.40) | 16, 6 | 61.49 (3.84) | 16, 12 | 63.39 (2.99) |

Wafer average, 9 die, 49.5 (4.13) g shear force, n = 180
Wafer average, random walk, 51.32 (7.94) g shear force, n = 100

TABLE II

Adhesion test of modified SU-8 according to the present invention by block shearing on untreated Cu seed wafers. Each block is a 210 um square with thickness ~140 um. Both systematic die site and random walk sampling were taken. Die site is defined by the central 12 × 16 die array with (1, 1) being the lower left-corner die. Modified SU-8 on Cu, No ash, Test speed: 5-um/s Land speed: 250 um/s Shear height: 10 um Overtravel: 10 um

| Die | Shear (g) n = 20 | Die | Shear (g) n = 20 | Die | Shear (g) n = 20 |
|---|---|---|---|---|---|
| 1, 1 | 59.02 (2.15) | 1, 6 | 59.02 (2.15) | 1, 12 | 57.70 (5.05) |
| 8, 1 | 64.64 (3.61) | 8, 6 | 64.64 (3.61) | 8, 12 | 63.72 (1.58) |
| 16, 1 | 66.99 (4.85) | 16, 6 | 66.99 (4.85) | 16, 12 | 67.45 (6.82) |

Wafer average, 9 die, 63.55 (3.54) g shear force, n = 180
Waver average, random walk, 61.21 (8.59) g shear force, n = 100

EXAMPLE 8

Verification of Improved Resistance to Cracking and Film Stress

Physical tests to measure the difference in resistance to cracking and film stress for modified and unmodified SU-8 epoxy resin-based photoresist materials were conducted. The two resins (modified and unmodified) were prepared generally as described above. The modified masking composition comprised about 62.4 weight percent SU-8 resin, 26.2 weight percent γ-butyrolactone, 6.3 percent CYRACURE®, 1.0 percent DOP, and 4.0 percent GPTMS.

In the first test, the via cracking frequency for wafers coated with modified and unmodified SU-8 was measured.

As is known to the art, via cracking arises from differences in the thermal expansion between the film and the substrate and is measured as a function of ultraviolet exposure dosage and cooling rate after the PEB. The cooling rate is given as either "fast" or "slow", with "fast" being defined as cooling from 90 degrees C. to about 22 degrees C. in about 4 minutes and "slow" being defined as cooling from 90 degrees C. to about 22 degrees C. in about 20 minutes.

As is apparent from Table III, the modified SU-8 photoresist material trends towards having a substantially lower percentage of via cracking than does the unmodified SU-8 photoresist film material under the same conditions.

TABLE III

Via cracking frequency and photodose/PEB cooling correlation for photoresist coatings on a wafer substrate. Only circular vias in the array were counted. Q1, Q2, etc. represent quadrants with Q1 being upper-left corner with flat facing down, clockwise to Q4. 40 vias in each quadrant were counted. Fast cooling is defined as a rate of ~4 min. from 90 C. to 22 C.; slow cooling is defined as a rate ~20 min. from 90 C. to 22 C.; NA indicates catastrophic failure of the wafer substrate.

| Photo dose | PEB cool- | Die position with % via cracking (Modified SU-8) | | | | Die position with % cracking (SU-8) | | | |
|---|---|---|---|---|---|---|---|---|---|
| MJ/cm2 | ing | Q1 | Q2 | Q3 | Q4 | Q1 | Q2 | Q3 | Q4 |
| 1200 | Fast | 100 | 100 | 100 | 100 | 100 | 100 | 100 | 100 |
| 1200 | Fast | 70 | 80 | 100 | 65 | 100 | 100 | 100 | 100 |
| 1200 | Slow | 20 | 40 | 15 | 25 | NA | NA | NA | NA |
| 1200 | Slow | 33 | 30 | 40 | 33 | NA | NA | NA | NA |
| 1570 | Fast | 40 | 33 | 40 | 33 | 100 | 90 | 100 | 80 |
| 1570 | Fast | 75 | 100 | 90 | 85 | 100 | 100 | 100 | 100 |
| 1570 | Slow | 40 | 60 | 50 | 53 | NA | NA | NA | NA |
| 1570 | Slow | 55 | 30 | 55 | 40 | NA | NA | NA | NA |
| 1940 | Fast | 100 | 80 | 90 | 60 | 80 | 100 | 100 | 95 |
| 1940 | Fast | 90 | 85 | 75 | 80 | 100 | 90 | 100 | 85 |
| 1940 | Slow | 42 | 58 | 33 | 53 | NA | NA | NA | NA |
| 1940 | Slow | 60 | 35 | 55 | 40 | NA | NA | NA | NA |
| 2310 | Fast | 60 | 45 | 30 | 40 | 100 | 100 | 90 | 100 |
| 2310 | Fast | 65 | 53 | 75 | 45 | 80 | 90 | 85 | 100 |
| 2310 | Slow | 5 | 10 | 15 | 0 | 30 | 20 | 60 | 28 |
| 2310 | Slow | 5 | 25 | 0 | 15 | 20 | 40 | 23 | 50 |

In a second test, real time wafer bow was measured for wafers coated with modified and unmodified SU-8 masks. All wafers were baked at 90° C. for 3 hours, and both after solvent bake bow and after PEB bow were measured after a 30 minute room temperature cooling period.

As can be seen from the data, the modified SU-8 films had substantially less wafer bow than did their unmodified counterparts when tested under the same conditions.

TABLE IV

Real-time wafer bow monitoring for 90 C/3 hour bake. Both after solvent bake and after PEB bow were measured after 30 minute room temperature cooling.

| Formulation | Modified SU-8 | | | SU-8 | | |
|---|---|---|---|---|---|---|
| Mask | Film | Dot | Dot | Film | Dot | Dot |
| Bake Temp C./ Time (hrs) | 90/3 | 90/3 | 90/3 | 90/3 | 90/3 | 90/3 |
| Before coat | 32 | 40 | NA | 25 | 33 | NA |
| After solvent bake | 66 | 74 | 74 | 97 | 101 | 108 |
| After expose | 44 | 42 | 63 | 55 | 55 | 83 |
| After PEB | 310 | 95 | 98 | 330 | 125 | 132 |
| After Develop | 300 | 39 | 50 | 300 | 45 | 48 |

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A photoresist masking material, comprising:

a) an octafunctional epoxidized novolac resin;

b) an organic solvent;

c) a photopolymerization initiator;

d) a plasticizer selected from the group consisting of dialkylphthalates, dialkylmalonates, dialkylsebacates, and dialkyladipates; and e) an adhesion promoter selected from the group consisting of glycidoxypropanetrimethoxysilane, mercaptopropyltrimethoxysilane, and aminopropyltrimethoxysilane.

2. The photoresist of claim 1, wherein said plasticizer is a dialkylphthalates.

3. The photoresist of claim 1, wherein said plasticizer is a dialkylmalonates.

4. The photoresist of claim 1, wherein said plasticizer is a dialkylsebacates.

5. The photoresist of claim 1, wherein said plasticizer is a dialkyladipates.

6. The photoresist of claim 1, wherein said adhesion promoter is a glycidoxypropanetrimethoxysilane.

7. The photoresist of claim 1, wherein said adhesion promoter is a mercaptopropyltrimethoxysilane.

8. The photoresist of claim 1, wherein said adhesion promoter is a aminopropyltrimethoxysilane.

9. A photoresist masking material according to claim 1 wherein said octafunctional epoxidized novolac resin is of the formula:

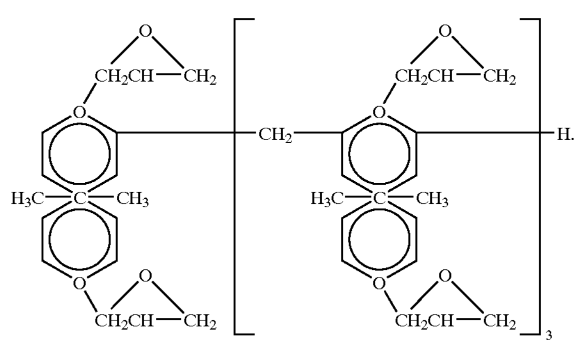

10. A photoresist masking material according to claim 1 wherein said solvent is present in an amount ranging between about 15% and about 45% by weight.

11. A photoresist masking material according to claim 1 wherein said solvent is present in an amount ranging between about 20% and about 30% by weight.

12. A photoresist masking material according to claim 1 wherein said solvent is present in an amount of about 25% by weight.

13. A photoresist masking material according to claim 1 wherein said photopolymerization initiator is present in an amount ranging between about 3% and about 10% by weight.

14. A photoresist masking material according to claim 1 wherein said photopolymerization initiator is present in an amount ranging between about 5% and about 8% by weight.

15. A photoresist masking material according to claim 1 wherein said photopolymerization initiator is present in an amount ranging between about 6% and about 7% by weight.

16. A photoresist masking material according to claim 1 wherein said photopolymerization initiator is a triaryl sulphonium $SbF_6$ salt.

17. A photoresist masking material according to claim 1 wherein said plasticizer is present in an amount ranging between about 0.5% and about 3% by weight.

18. A photoresist masking material according to claim 1 wherein said plasticizer is present in an amount of about 2% by weight.

19. A photoresist masking material according to claim 1 wherein said adhesion promoter is present in an amount ranging between about 1% and about 6% by weight.

20. A photoresist masking material according to claim 1 wherein said adhesion promoter is present in an amount ranging between about 3% and about 4% by weight.

21. A photoresist masking material, comprising:

a) an octafunctional epoxidized novolac resin;

b) an organic solvent;

c) a photopolymerization initiator;

d) a plasticizer selected from the group consisting of dialkylphthalates, dialkylmalonates, dialkylsebacates, dialkyladipates, and diglycidyl hexahydrophthalates; and e) an adhesion promoter selected from the group consisting of glycidoxypropanetrimethoxysilane, mercaptopropyltrimethoxysilane, and aminopropyltrimethoxysilane, wherein said solvent has a boiling point of between 160° C. and 260° C.

22. A photoresist masking material according to claim 21 wherein said solvent has a boiling point of between 190° C. and 220° C.

23. A photoresist masking material according to claim 21 wherein said solvent has a boiling point of between 200° C. and 210° C.

24. A photoresist masking material, comprising:

a) an octafunctional epoxidized novolac resin;

b) an organic solvent;

c) a photopolymerization initiator;

d) a plasticizer selected from the group consisting of dialkylphthalates, dialkylmalonates, dialkylsebacates, dialkyladipates, and diglycidyl hexahydrophthalates; and e) an adhesion promoter selected from the group consisting of glycidoxypropanetrimethoxysilane, mercaptopropyltrimethoxysilane, and aminopropyltrimethoxysilane, herein said solvent is gamma butyrolactone.

25. A photoresist masking material, comprising:

a) 50% to 75% by weight of an octafunctional epoxidized novolac resin of the formula:

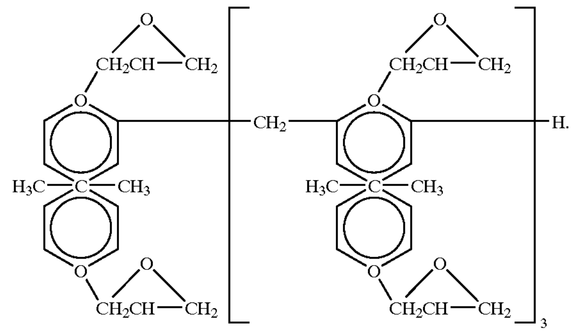

b) 15% to 45% by weight of an organic solvent;

c) 3% to 7% by weight a photopolymerization initiator;

d) 0.5% to 3% by weight of a plasticizer selected from the group consisting of dialkylphthalates, dialkylmalonates, dialkylsebacates, and dialkyladipates; and e) 1% to 6% by weight of an adhesion promoter selected from the group consisting of glycidoxypropanetrimethoxysilane, mercaptopropyltrimethoxysilane, and aminopropyltrimethoxysilane.

26. A method of improving resistance to cracking and film stress of a negative photoresist masking composition comprising an octofunctional epoxidized novolac resin of the formula

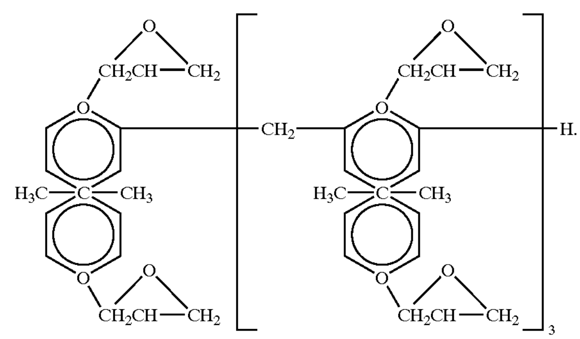

an organic solvent, and a photopolymerization initiator, said method comprising:

adding to the photoresist masking composition 0.5% to 3% by weight of a plasticizer selected from the group consisting of dioctylphthalates, dialkylmalonates, dialkylsebacates, and dialkyladipates.

27. The photoresist of claim 26, wherein said plasticizer is a dialkylphthalates.

28. The photoresist of claim 26, wherein said plasticizer is a dialkylmalonates.

29. The photoresist of claim 26, wherein said plasticizer is a dialkylsebacates.

30. The photoresist of claim 26, wherein said plasticizer is a dialkyladipates.

* * * * *